United States Patent
Yen et al.

(10) Patent No.: US 11,315,864 B2
(45) Date of Patent: Apr. 26, 2022

(54) PACKAGE STRUCTURE OF COMMON-SOURCE COMMON-GATE GALLIUM NITRIDE FIELD-EFFECT TRANSISTOR

(71) Applicant: GaN Power Technology Co., Ltd., Taichung (TW)

(72) Inventors: Tsung Hsien Yen, Taichung (TW); Hsing Yeh Wang, Taichung (TW); Feng Jui Shen, Taichung (TW)

(73) Assignee: GAN POWER TECHNOLOGY CO., LTD., Taichung (TW)

( * ) Notice: Subject to any disclaimer, the term of this patent is extended or adjusted under 35 U.S.C. 154(b) by 134 days.

(21) Appl. No.: 16/933,668

(22) Filed: Jul. 20, 2020

(65) Prior Publication Data

US 2022/0020677 A1    Jan. 20, 2022

(51) Int. Cl.
| | |
|---|---|
| *H01L 29/778* | (2006.01) |
| *H01L 23/498* | (2006.01) |
| *H01L 29/20* | (2006.01) |
| *H01L 27/12* | (2006.01) |
| *H01L 23/495* | (2006.01) |
| *H01L 25/07* | (2006.01) |
| *H01L 23/31* | (2006.01) |

(52) U.S. Cl.
CPC .... *H01L 23/49838* (2013.01); *H01L 23/3107* (2013.01); *H01L 23/495* (2013.01); *H01L 23/49575* (2013.01); *H01L 25/072* (2013.01); *H01L 27/12* (2013.01); *H01L 29/2003* (2013.01); *H01L 29/7786* (2013.01); *H01L 29/7787* (2013.01)

(58) Field of Classification Search
CPC . H01L 27/12; H01L 27/0605; H01L 29/7786; H01L 29/7787
See application file for complete search history.

*Primary Examiner* — Grant S Withers
(74) *Attorney, Agent, or Firm* — Muncy, Geissler, Olds & Lowe, PC

(57) ABSTRACT

A package structure of a common-source common-gate gallium nitride field-effect transistor is disclosed, including a lead frame. A gallium nitride field-effect transistor and a metal oxide semiconductor are directly disposed on the lead frame. The gallium nitride field-effect transistor includes a first matrix directly disposed on the lead frame. A first drain, a first gate, and a first source are disposed on a surface side of the first matrix, and the first drain and the first gate are separately electrically connected to the lead frame. The metal oxide semiconductor includes a second matrix directly disposed on the lead frame. A second drain, a second gate, and a second source are disposed on a surface side of the second matrix, the second drain is directly electrically connected to the first source, and the second gate and the second source are separately electrically connected to the lead frame.

3 Claims, 2 Drawing Sheets

PACKAGE STRUCTURE OF COMMON-SOURCE COMMON-GATE GALLIUM NITRIDE FIELD-EFFECT TRANSISTOR

FIELD OF TECHNOLOGY

The present invention relates to semiconductor transistors, and in particular, to a package structure of a common-source common-gate gallium nitride field-effect transistor.

BACKGROUND

FIG. 2 shows a conventional package structure of a common-source common-gate gallium nitride field-effect transistor. The conventional package structure includes a lead frame 5, and a vertical metal oxide semiconductor 7 and a gallium nitride field-effect transistor 6 are disposed on the lead frame 5. A drain 61, a gate 62, and a source 63 are disposed on the gallium nitride field-effect transistor 6, and a drain 71, a gate 72, and a source 73 are disposed on the metal oxide semiconductor 7. The drain 71 of the vertical metal oxide semiconductor 7 is located on a bottom surface. To smoothly electrically connect to the source 63 of the gallium nitride field-effect transistor 6, a layer of metal coating 81 with a relatively large area needs to be disposed beneath the drain 71 of the semiconductor 7. In this way, an insulating ceramic substrate 82 needs to be further disposed on the lead frame 5, to isolate the metal coating 81 and the lead frame 5. Therefore, both the structure and a manufacturing process of the conventional common-source common-gate gallium nitride field-effect transistor are relatively complex, and there is a disadvantage of relatively high costs.

SUMMARY

A main objective of the present invention is to provide a package structure of a common-source common-gate gallium nitride field-effect transistor that uses a horizontal semiconductor, so that a drain of the semiconductor is directly electrically connected to a source of a gallium nitride transistor, thereby bringing a structure simplifying effect.

To achieve the foregoing objective, the present invention provides a package structure of a common-source common-gate gallium nitride field-effect transistor, including:

a lead frame;

a gallium nitride field-effect transistor, including a first matrix directly disposed on the lead frame, where a first drain, a first gate, and a first source are disposed on a surface side of the first matrix, and the first drain and the first gate are separately electrically connected to the lead frame; and a metal oxide semiconductor, including a second matrix directly disposed on the lead frame, where a second drain, a second gate, and a second source are disposed on a surface side of the second matrix, and the second drain is directly electrically connected to the first source, and the second gate and the second source are separately electrically connected to the lead frame.

In an embodiment, a package body covers the lead frame, the gallium nitride field-effect transistor, and the metal oxide semiconductor.

Preferably, the lead frame is provided with a pin extending out of the package body.

DESCRIPTION OF THE EMBODIMENTS

Figure 1:
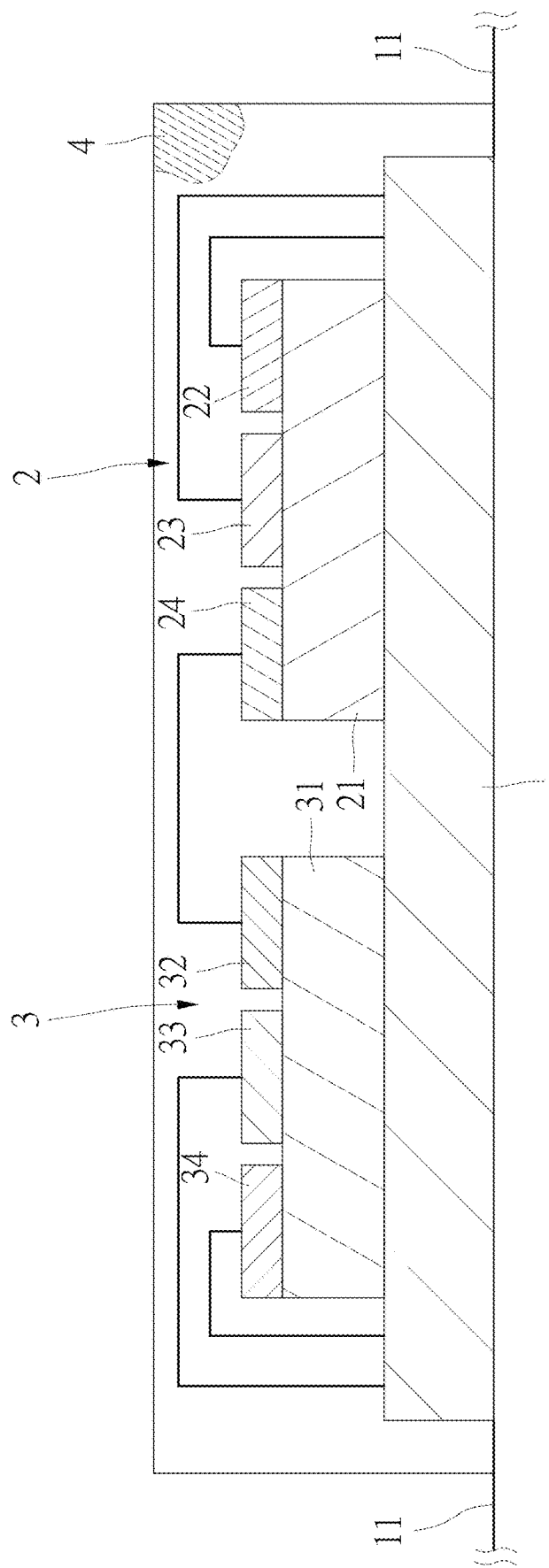
FIG. 1 is a schematic structural diagram according to the present invention.
Figure 2:
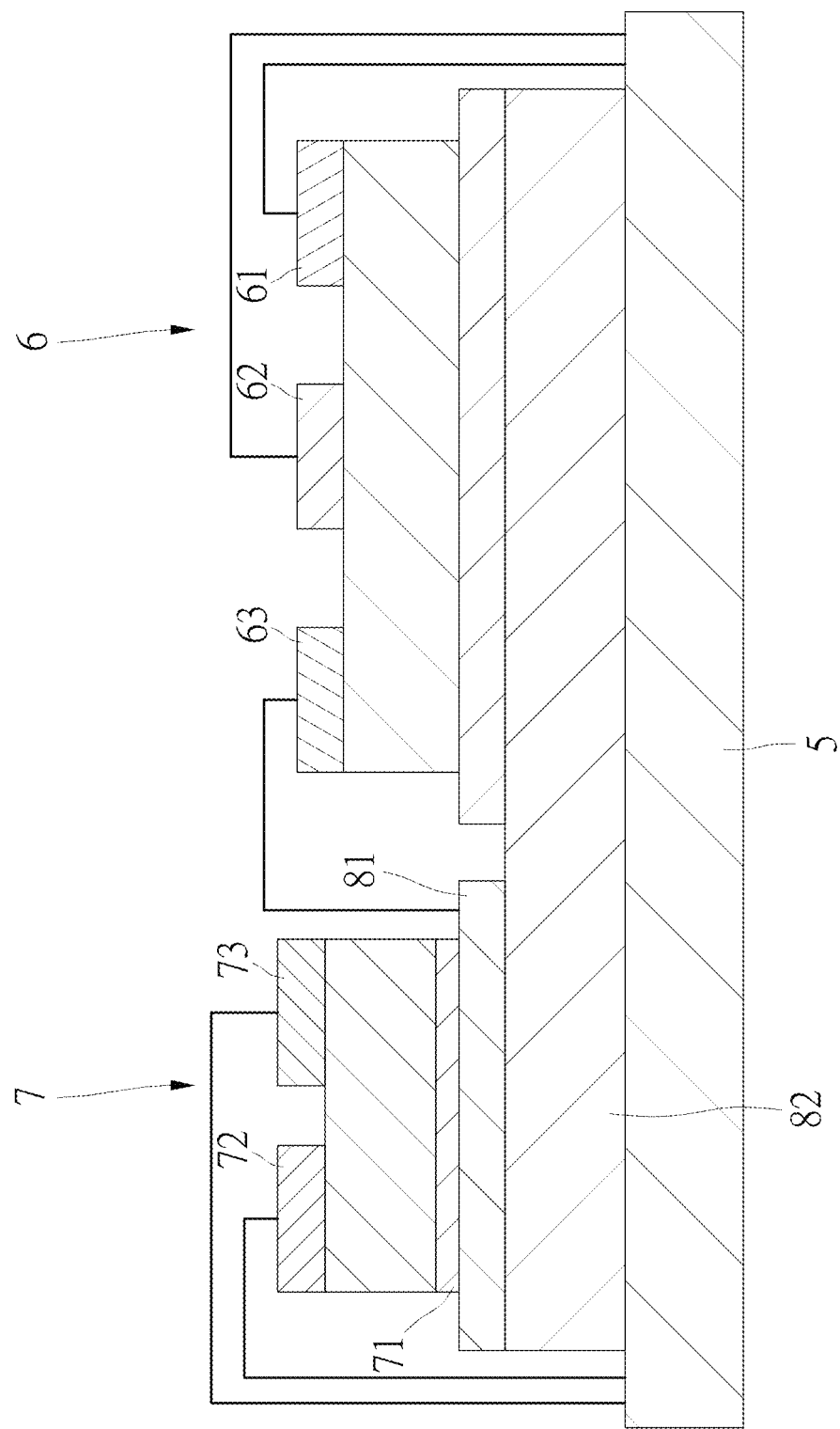
FIG. 2 is a schematic structural diagram of a conventional structure.

FIG. 1 shows a package structure of a common-source common-gate the gallium nitride field-effect transistor according to the present invention. The package structure includes a lead frame 1. A gallium nitride field-effect transistor 2 (GaN FET) and a horizontal metal oxide semiconductor 3 (MOS) are directly disposed on the lead frame 1. The gallium nitride field-effect transistor 2 includes a first matrix 21 directly disposed on the lead frame 1, a first drain 22, a first gate 23, and a first source 24 are disposed on a surface side of the first matrix 21, and the first drain 22 and the first gate 23 are separately electrically connected to the lead frame 1. The metal oxide semiconductor 3 includes a second matrix 31 directly disposed on the lead frame 1, a second drain 32, a second gate 33, and a second source 34 are disposed on a surface side of the second matrix 31, and the second gate 33 and the second source 34 are separately electrically connected to the lead frame 1.

Accordingly, the first source 24 of the gallium nitride field-effect transistor 2 is directly electrically connected to the second drain 32 of the metal oxide semiconductor 3, to form a common-source common-gate form. Next, a package body 4 covers the lead frame 1, the gallium nitride field-effect transistor 2, and the metal oxide semiconductor 3, and a pin 11 extending out of the package body 4 extends out of the lead frame 1.

Based on the foregoing structure, in the present invention, the first source 24 of the gallium nitride field-effect transistor 2 is directly electrically connected to the second drain 32 of the metal oxide semiconductor 3. Therefore, a structure of a metal coating and a ceramic substrate in a conventional transistor is omitted, thereby simplifying the structure and a manufacturing process, and further reducing costs.

What is claimed is:

1. A package structure of a common-source common-gate gallium nitride field-effect transistor, comprising:

a lead frame;

a gallium nitride field-effect transistor, comprising a first body directly disposed on the lead frame, wherein a first drain, a first gate, and a first source are disposed on a surface side of the first matrix, and the first drain and the first gate are separately electrically connected to the lead frame; and a metal oxide semiconductor, comprising a second body directly disposed on the lead frame, wherein a second drain, a second gate, and a second source are disposed on a surface side of the second matrix, and the second drain is directly electrically connected to the first source, and the second gate and the second source are separately electrically connected to the lead frame.

2. The package structure of the common-source common-gate gallium nitride field-effect transistor according to claim 1, wherein a package body covers the lead frame, the gallium nitride field-effect transistor, and the metal oxide semiconductor.

3. The package structure of the common-source common-gate gallium nitride field-effect transistor according to claim 2, wherein the lead frame is provided with a pin extending out of the package body.

* * * * *